(12) United States Patent
Sin et al.

(10) Patent No.: US 8,102,104 B2
(45) Date of Patent: Jan. 24, 2012

(54) FRONT-SIDE FILTER AND PLASMA DISPLAY PANEL DEVICE INCLUDING THE FRONT-SIDE FILTER

(75) Inventors: Dong-keun Sin, Hwaseong-si (KR);
Eui-soo Kim, Daegu Metropolitan (KR);
Nam-soo Kim, Chilgok-gun (KR);
Jong-won Lee, Gumi-si (KR);
Young-chae Cho, Suwon-si (KR)

(73) Assignee: Samsung Corning Precision Materials Co., Ltd., Gyeongsangbuk-Do (KR)

( * ) Notice: Subject to any disclaimer, the term of this patent is extended or adjusted under 35 U.S.C. 154(b) by 524 days.

(21) Appl. No.: 11/267,998

(22) Filed: Nov. 7, 2005

(65) Prior Publication Data

US 2006/0119244 A1    Jun. 8, 2006

(30) Foreign Application Priority Data

Dec. 3, 2004   (KR) .................. 10-2004-0101248

(51) Int. Cl.
*H01K 1/26* (2006.01)
*H01J 17/49* (2006.01)
(52) U.S. Cl. ......... 313/112; 313/110; 313/111; 313/582
(58) Field of Classification Search .......... 313/495–512, 313/582, 110–112, 479
See application file for complete search history.

(56) References Cited

U.S. PATENT DOCUMENTS 5,265,273 A    11/1993   Goodwin et al.
(Continued)

FOREIGN PATENT DOCUMENTS

| DE | 197 20 974 C 1 | 5/1997 |
|---|---|---|
| JP | 09-331488 | 12/1997 |
| JP | 10-149109 | 6/1998 |

(Continued)

OTHER PUBLICATIONS

English Translation of Austrian Office Action, issued in corresponding Turkish Patent Application No. 2005/04834 mailed on Sep. 4, 2007.

*Primary Examiner* — Karabi Guharay
*Assistant Examiner* — Elmito Breval
(74) *Attorney, Agent, or Firm* — McDermott Will & Emery LLP

(57) ABSTRACT

Provided is a front-side filter which can be easily attached to a cover of a display device, but is difficult to detach from the cover even after long term use and further provided is a PDP device including the same filter. The front-side filter includes a filter base having at least one function among a near-infrared ray shielding function, and a neon light shielding function, and an electromagnetic wave shielding function; and an antireflective layer with an edge pattern, formed on a side of the filter base in such a way that the entire edge portion or a part of the edge portion of the filter base is exposed through the edge pattern to provide a fixing means formed in the edge pattern. The plasma display panel device includes a case, a cover for covering an upper surface of the case, a driving circuit board enclosed by the case, a panel assembly disposed on the driving circuit board and enclosed by the case, and a front-side filter including a filter base having at least one function among a near-infrared ray shielding function, and a neon light shielding function, and an electromagnetic wave shielding function; and an antireflective layer with an edge pattern, formed on a side of the filter base in such a way that the entire edge portion or part of the edge portion of the filter base is exposed through the edge pattern to provide a fixing means formed in the edge pattern.

9 Claims, 5 Drawing Sheets

U.S. PATENT DOCUMENTS

| | | |
|---|---|---|
| 5,448,405 A | 9/1995 | Clausen et al. |
| 6,391,462 B1 | 5/2002 | Jang |
| 6,525,786 B1 | 2/2003 | Ono |
| 2004/0090170 A1* | 5/2004 | Cha et al. .................. 313/489 |
| 2004/0201883 A1 | 10/2004 | Kim |
| 2004/0214023 A1* | 10/2004 | Park et al. .................. 428/458 |
| 2004/0239248 A1* | 12/2004 | Chang et al. ............... 313/582 |

FOREIGN PATENT DOCUMENTS

| | | |
|---|---|---|
| JP | 2001-188121 A | 7/2001 |
| JP | 2003005669 A * | 1/2003 |
| JP | 2003-086854 | 3/2003 |
| JP | 2004-070029 | 3/2004 |
| WO | WO 00/43832 | 7/2000 |
| WO | WO 2004/056564 | 7/2004 |

* cited by examiner

FRONT-SIDE FILTER AND PLASMA DISPLAY PANEL DEVICE INCLUDING THE FRONT-SIDE FILTER

BACKGROUND OF THE INVENTION

This application claims priority from Korean Patent Application No. 2004-0101248 filed on Dec. 3, 2004, in the Korean Intellectual Property Office, the disclosure of which is incorporated herein in its entirety by reference.

1. Field of the Invention

The present invention relates to a front-side filter and a plasma display panel device. More particularly, the present invention relates to a front-side filter having an edge pattern enabling the front-side filter to be fixed to a plasma display panel, and a plasma display panel (PDP) device including the front-side filter.

2. Description of the Related Art

As modern society becomes more information-oriented, photoelectronic devices are advancing and being more widely used. In particular, image display devices are widely used in a variety of applications, including for TV screens, monitors of personal computers, etc. Wide screens and a thin build have become the mainstream technology for high performance image display devices.

Plasma display panels are gaining popularity as a next-generation display device to replace the CRT because of advantages in thinness, high definition and a large display. A PDP device includes a plasma display panel on which an image is displayed using a gas discharge phenomenon, and exhibits superior display capabilities, including high display capacity, high brightness, high contrast, clear latent image, and a wide viewing angle.

FIG. 1 is a perspective view illustrating a conventional plasma display panel (PDP) device.

Referring to FIG. 1, a PDP device 10 includes a case 140, a cover 100 covering an upper surface of the case 140, a driving circuit board 130 enclosed by the case 140, a panel assembly 120 including discharge cells in which a gas discharge occurs, and a front-side filter 110.

In the PDP device 10, when a direct current (DC) or an alternating current (AC) voltage is applied to electrodes, a gas plasma discharge is created, resulting in the emission of ultraviolet (UV) light. The UV emission excites adjacent phosphor materials, resulting in electromagnetic emission of visible light.

However, such PDP devices have several problems associated with driving characteristics, including an increase in electromagnetic wave radiation, near-infrared emission, and phosphor surface reflection, and an obscured color purity compared to a cathode ray tube (CRT) due to orange light emitted from helium (He) or xenon (Xe) used as a sealing gas.

The electromagnetic waves and near-infrared rays generated in PDPs may adversely affect peripheral electronic devices and cause malfunction of electronics devices such as wireless telephones and remote controllers. Thus, in order to make use of such PDPs, there is still a need to reduce the electromagnetic waves and near-infrared rays emitted from the PDPs to a predetermined level or less. In this respect, various front-side filters 110 have been used for the purposes of shielding electromagnetic waves or near-infrared rays emitted from the PDPs, reducing reflection of light and/or enhancing color purity, for example.

FIG. 2 is an enlarged perspective view of the front-side filter 110 shown in FIG. 1.

Referring to FIG. 2, a conventional front-side filter 110 for a PDP device includes an antireflective layer 111 serving as the front surface of the filter, a near-infrared ray shielding layer 113, a neon light shielding layer 115, a transparent substrate 117 and an electromagnetic wave shielding layer 119. The front-side filter 110 has screw holes 112 at its corners and it is fixed to a plasma display panel device (10 in FIG. 1) using coupling means such as screws 114 screwed into the screwed holes 112.

Alternatively, the front-side filter 110 may be fixed to a PDP device in another way. For example, the front-side filter 100 may be glued to the cover (100 in FIG. 1) of the PDP device using a double-sided adhesive applied to edge portions of the antireflective layer 110.

Such known methods for fixing a front-side filter to a PDP device have disadvantages. For example, the former method is so troublesome because screw holes 112 need to be formed in the front-side filter 110 and many screws need to be mated with the corresponding screw holes one by one. The latter method is also disadvantageous in that application of an adhesive to the antireflective layer is not easy, taking into account the functions of the antireflective layer, that is, an antireflective function and an anti-smudge function. Further, the latter method is also problematic in that there is a possibility of detachment of the front-side filter from the cover after long term use.

SUMMARY OF THE INVENTION

The present invention provides a front-side filter for a PDP device that can be easily attached to a main body of a display device but which does not easily become detached from the main body after long term use.

The present invention proves a PDP device including the front-side filter.

The above stated objects as well as other objects, features and advantages, of the present invention will become clear to those skilled in the art upon review of the following description.

According to an aspect of the present invention, there is provided a front-side filter including a filter base having at least one function among a near-infrared ray shielding function, a neon light shielding function and an electromagnetic wave shielding function and an antireflective layer formed on a side of the filter base, where the antireflective layer has an edge pattern formed in such a way that the entire edge portion or at least part of the edge portion of the filter base is exposed through the edge pattern so that an adhesive is applied to the exposed portion of the filter base through the edge pattern.

According to another aspect of the present invention, there is provided a plasma display panel device, including a case, a cover for covering an upper surface of the case, a driving circuit board enclosed by the case, a panel assembly disposed on the driving circuit board and enclosed by the case, and a front-side filter including a filter base having at least one function among a near-infrared ray shielding function, and a neon light shielding function, and an electromagnetic wave shielding function, and an antireflective layer with an edge pattern formed on a side of the filter base in such a way that the entire edge portion or part of the edge portion of the filter base is exposed through the edge pattern to provide a fixing means formed in the edge pattern.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
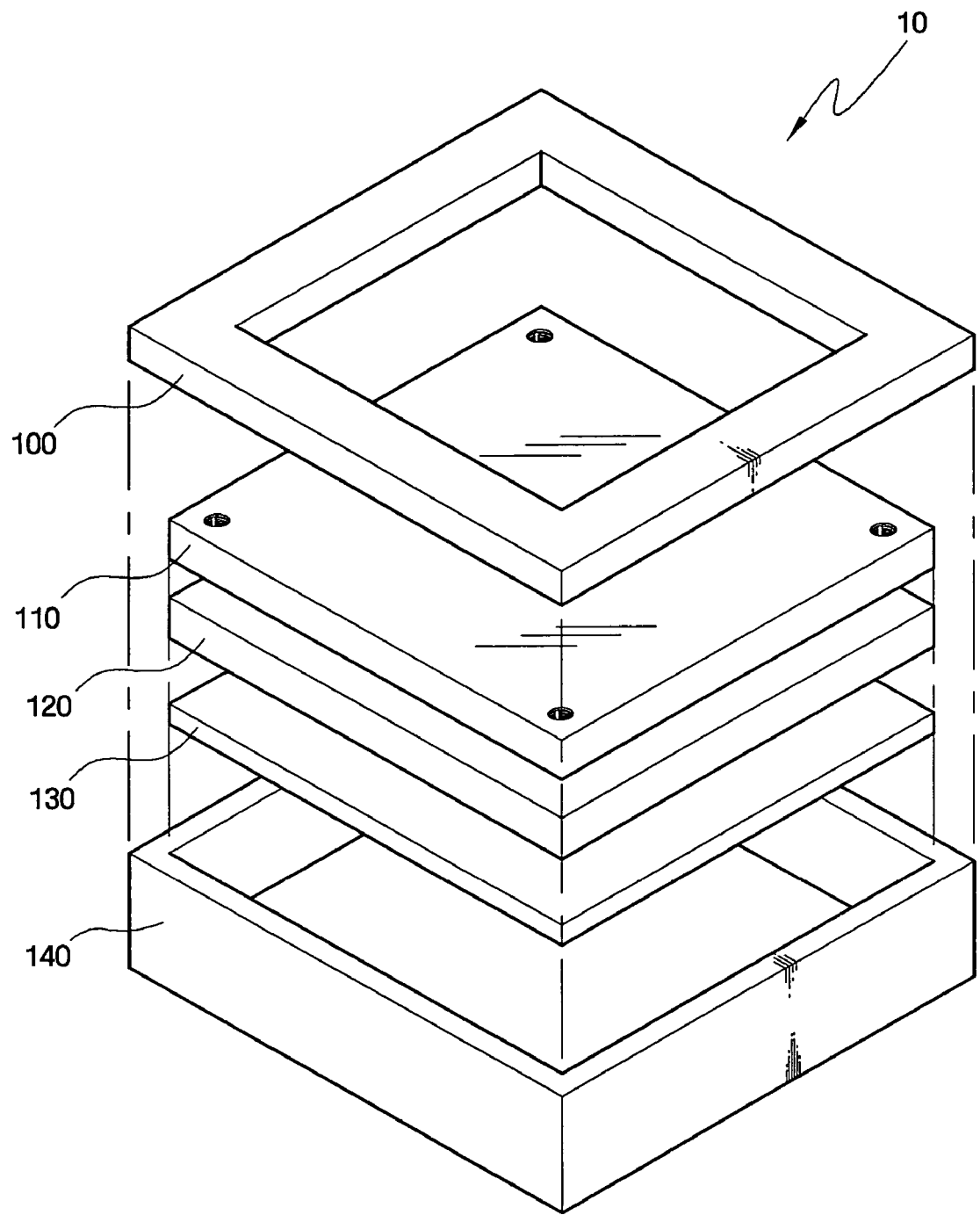
FIG. 1 is an exploded perspective view illustrating a conventional plasma display panel (PDP) device.
Figure 2:
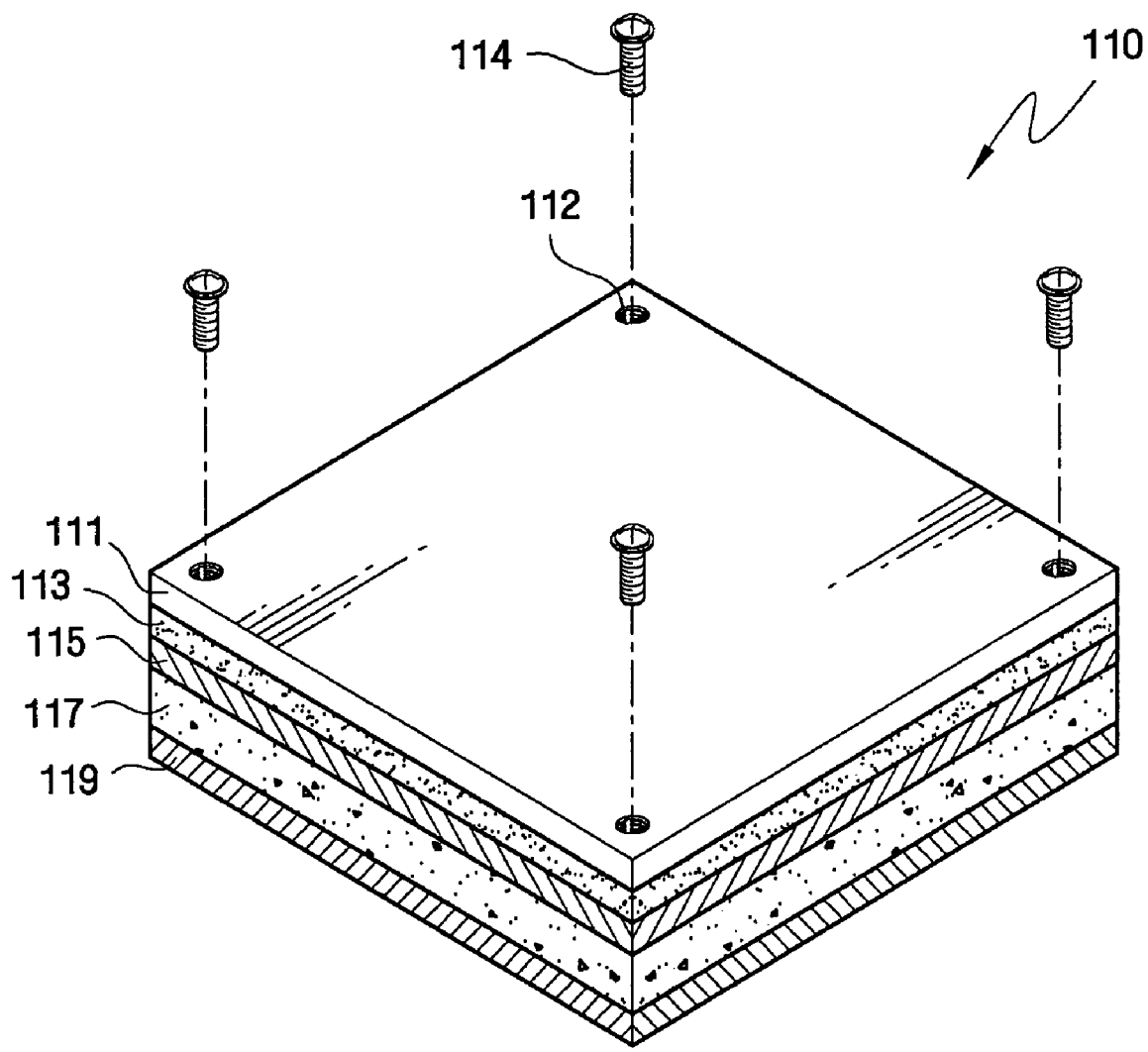
FIG. 2 is an enlarged perspective view of a front-side filter of the PDP device of FIG. 1.

Advantages and features of the present invention and methods of accomplishing the same may be understood more readily by referring to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Figure 3:
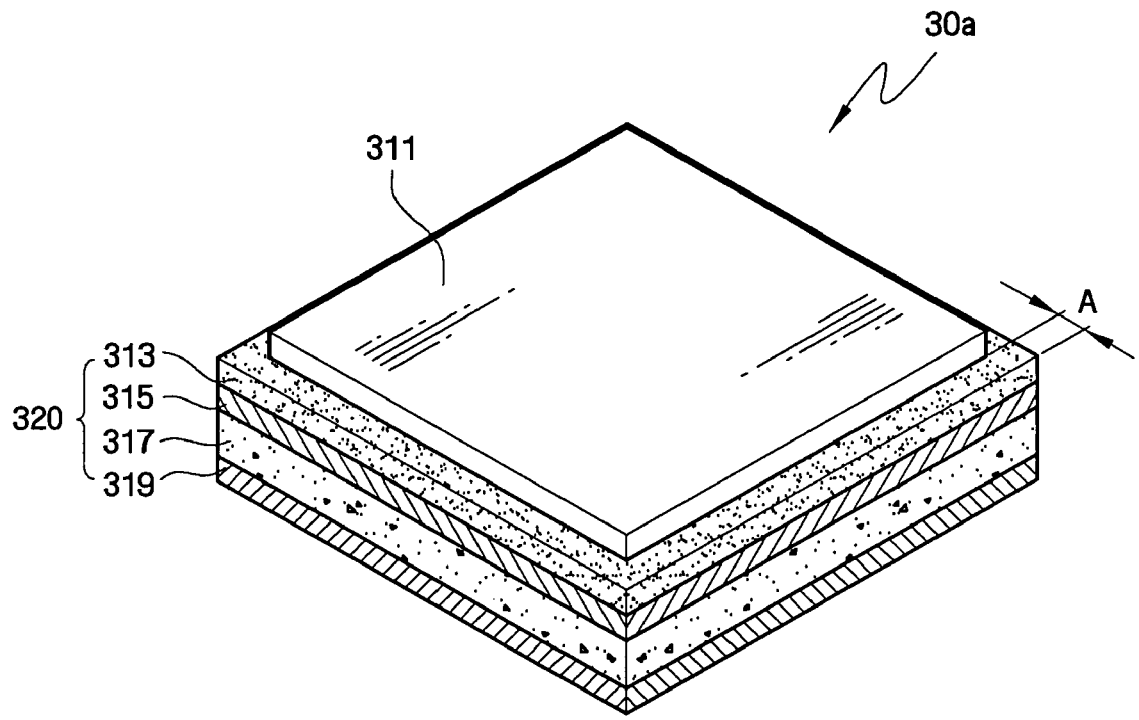
FIG. 3 is an enlarged perspective view of a front-side filter for a PDP device, according to an embodiment of the present invention.

FIG. 3 is an enlarged perspective view of a front-side filter 30a for a PDP device according to an embodiment of the present invention.

Referring to FIG. 3, the front-side filter 30a includes a filter base 320, in which one or more layers having various shielding functions are formed on a transparent substrate 317, and an antireflective layer 311.

The filter base 320 has a stacked structure in which the transparent substrate 317 and one or more layers selected from a near-infrared ray shielding layer 313, a neon light shielding layer 315 and an electromagnetic wave shielding layer 319 are stacked in random order.

As illustrated in FIG. 3, while the present invention has been described particularly with reference to several individual layers forming the filter base 320 of the front-side filter 30a, the individual layers performing a near-infrared ray shielding function, a neon light shielding function, and an electromagnetic wave shielding function, and an antireflection function, respectively, the present invention is not be limited thereto. That is, the filter base 320 may include one or more layers and each layer may perform a single function or at least two functions selected from the above-stated functions.

Further, referring to FIG. 3, in the front-side filter 30a, the filter base 320 has a structure in which the neon light shielding layer 315 and the near-infrared ray shielding layer 313 are stacked on a surface of the transparent substrate 317 while the electromagnetic wave shielding layer 319 is provided on the other surface of the transparent substrate 317. However, the order in which the layers are stacked may be different than that shown in FIG. 3.

The transparent substrate 317, which serves as a matrix layer of the front-side filter 30a, is provided with the neon light shielding layer 315 and the near-infrared layer 313 on one surface thereof and the electromagnetic wave shielding layer 319 on the other surface thereof.

The transparent substrate 317 is generally made of a transparent material such as tempered or semi-tempered glass or acrylic with a thickness in the range from 2.0 to 3.5 mm. Glass has specific gravity of 2.6. Accordingly, it is difficult to implement a light and thin substrate using glass. Thus, a front-side filter using a glass substrate increases the total weight of a PDP device when it is assembled into a PDP set. However, despite such disadvantages, a glass substrate is advantageous in that it provides enhanced scattering properties.

According to one embodiment of the present invention, the transparent substrate 317 is made of an inorganic compound such as glass or quartz, or a transparent polymer material. The transparent polymer is suitable for use as a substrate material because it is not brittle.

The transparent substrate 317 is generally made of acrylic or polycarbonate, but is not limited thereto.

The transparent substrate 317 desirably has high transparency and good thermal resistance, and may be formed as a polymer form or a stacked structure of polymer forms. The transparent substrate 317 preferably has a visible light transmittance of 80% or more and high heat resistance, that is, a glass transition point of 60° C. or higher.

The polymer form may be transparent in a visible wavelength region, and examples of polymer materials include, but are not limited to, polyethyleneterephthalate (PET), polysulfone (PS), polyethersulfone (PES), polystyrene, polyethylenenaphthalate, polyacrylate, polyetheretherketone (PEEK), polycarbonate (PC), polypropylene (PP), polyimide, triacetylcellulose (TAC), and polymethylmethacrylate (PMMA). It is preferable to use PET because it provides advantages of cost, thermal resistance, and transparency.

Generally, red visible light emitted from plasma in a panel assembly appears as orange light. The neon light-shielding layer 315 performs color correction from orange to red. For color correction, it is more preferable that visible light emitted from plasma in the panel assembly passes through the neon light-shielding layer 315 and then the near-infrared shielding layer 313 rather than through the near-infrared shielding layer 313 and then the neon light-shielding layer 315. Thus, it is more efficient to arrange the neon light-shielding layer 315 to be closer to a panel assembly.

The neon light-shielding layer 315 uses a colorant with selective absorptivity capable of absorbing unfavorably emitted orange light with wavelengths in the range from 580 to 600 nm to increase a color reproduction range of a display and to improve screen sharpness. The colorant may be a dye or a pigment.

The colorant may be an organic colorant having a neon light-shielding function, such as anthraquinones, cyanines, azos, stilbenes, phthalocyanines, or methines, but the present invention is not limited thereto. The type and concentration of the colorant are not particularly defined herein since they are determined by an absorption wavelength, an absorption coefficient, and transmission characteristics required for a display.

The near-infrared shielding layer 313 and the neon light shielding layer 315 serve to shield strong near-infrared rays radiated from a panel assembly, which cause electronic devices such as wireless telephones and remote controllers to malfunction.

The near-infrared ray shielding layer 313 and the neon light shielding layer 315 may be formed as a hybrid layer.

The electromagnetic wave shielding layer 319 is formed on the other surface of the transparent substrate 317 and serves to prevent electromagnetic waves, which are created upon applying a high voltage to a panel assembly for a plasma discharge, from leaking to the outside of a PDP device.

In order to shield the electromagnetic waves, it is preferable that the surface of a PDP device is covered with a material with high conductivity.

According to an embodiment of the present invention, the electromagnetic wave shielding layer for shielding the electromagnetic waves may be formed as a conductive mesh film or a multi-layered transparent conductive structure including a metal thin film and a highly reflective transparent thin film.

The electromagnetic wave shielding layer 319 is formed on the lower surface of the transparent substrate 317, that is, on the surface facing the panel assembly, but the present invention is not limited to such an arrangement.

The conductive mesh film may be a grounded metal mesh, or a synthetic resin or metal fiber mesh coated with metal. Any metal having excellent electric conductivity and processability can be used for the conductive mesh film.

Examples of suitable metals include copper, chrome, nickel, silver, tungsten and aluminum. It is preferable to use copper and nickel as the metal because they provide advantages of cost, electric conductivity and processability.

There are two methods of preparing the conductive mesh film: (a) laminating a thin metal layer and patterning it by photo-etching and (b) directly forming a metal film pattern by plating.

The metal film pattern may be 1 to 20 μm in thickness, and more preferably, 3 to 10 μm. If the metal film pattern is thinner than the defined range, shielding capability is deteriorated. On the contrary, if the metal film pattern is too thick manufacturing time is increased. Generally, sheet resistance of a substrate provided with the metal mesh is 0.5%/sq. or less.

In the multi-layered transparent conductive structure, a highly reflective transparent thin film such as indium tin oxide (ITO) may be used as an electromagnetic wave shielding layer. In the multi-layered conductive structure, a metal thin film and a highly reflective transparent thin film are alternately stacked, where the metal thin film may be made of Au, Ag, Co, Pt or Pd, and the highly reflective transparent thin film may be made of indium oxide, tin oxide or zinc oxide.

The metal thin film has many advantages such as high conductivity and high near-infrared ray shielding capability exhibited due to its reflecting or absorbing properties over a wide range, but has a disadvantage of low transparency for visible light. On the other hand, the highly reflective transparent thin film exhibits low reflectivity with respect to a near-infrared ray and has low conductivity, and is excellent in transparency.

Accordingly, the multi-layered transparent conductive structure having both the metal thin film and the highly reflective transparent thin film has a synergistic effect, such as high conductivity, enhanced near-infrared ray shielding capability and high transparency for visible light.

Here, the electromagnetic wave shielding function is achieved as the electromagnetic wave shielding layer 319 reflects and absorbs the electromagnetic waves. In order to absorb the electromagnetic waves, it is necessary to use a thin conductive metal layer as the electromagnetic wave shielding layer 319.

In addition, in order to completely absorb electromagnetic waves emitted from a display device, the conductive metal thin film needs to have a predetermined thickness or greater. However, as the thickness of the conductive metal thin film increases, the conductive metal thin film exhibits poor transparency for visible light.

On the other hand, the multi-layered transparent conductive structure in which the metal thin films and highly reflective transparent thin films are alternately stacked has an increased reflection interface, thereby facilitating reflection of the electromagnetic waves.

The metal thin film may be made of silver or a silver alloy. Silver may be preferably used as a material of the metal thin film because it has excellent conductivity, reflectance of infrared rays and high transparency for visible light even in the case of multi-layered stacks.

However, silver is problematic in that it is easily deteriorated by pollutants, moisture, heat and light due to its low chemical and physical stability. In this respect, it is desirable that a silver alloy containing at least one metal, which is stable in ambient conditions, such as gold (Au), platinum (Pt), palladium (Pd), copper (Co), indium (In) or tin (Sn) be used as a material for the metal thin film.

Generally, if a metal is added to silver, the conductivity and excellent optical characteristics of silver deteriorate. Accordingly, it is preferable that the multi-layered transparent conductive structure includes at least one metal thin film made of pure silver instead of a silver alloy.

In the multi-layered transparent conductive structure, if all the metal thin films are made of pure silver, it is possible for the electromagnetic wave shielding layer 310 to have good conductivity and optical characteristics but the multi-layered transparent conductive structure may easily deteriorate by its surroundings.

The metal thin film may be formed by any known methods, including sputtering, ion-plating, vacuum deposition, plating, etc.

The highly reflective transparent thin film is transparent to visible light and prevents visible light from being reflected from the metal thin layer due to a difference in reflectivity between itself and the metal thin film.

The highly reflective transparent thin film may be made of indium oxide, titanium oxide, zirconium oxide, bismuth oxide, tin oxide, zinc oxide, antimony oxide, tantalum oxide, cerium oxide, neodymium oxide, lantana oxide, thorium oxide, magnesium oxide, potassium oxide, a mixture of two or more of these oxides, or zinc sulfide.

In such oxides or sulfides, even if there is a difference in the stoichiometric composition between a metallic element and oxygen or sulfur contained in the oxides or sulfides, the oxides or sulfides can be used without limitations provided that optical characteristics thereof are not seriously changed. Specifically, ITO, which is a composition of indium oxide and tin oxide, is preferably used from the viewpoints of high transparency, high reflectivity, high growth rate and good adhesiveness to the metal thin layer.

Further, an oxide semiconductor thin film with high conductivity such as the ITO enhances electromagnetic wave absorption characteristics and conductivity of the electromagnetic wave shielding layer 319. The highly reflective transparent thin film may be formed by any known methods, including sputtering, ion-plating using an ion beam-assisted-vacuum deposition method, wet-coating, etc.

Among the methods, sputtering is preferably employed because it is advantageous from the viewpoints of film thickness control and multi-layer stacking and it is possible to easily, repeatedly and continuously grow the metal thin films and the highly reflective transparent thin films.

According to one embodiment of the present invention, highly reflective transparent thin films of indium oxide and metal thin layers of silver or a silver alloy are alternately and continuously grown by sputtering.

The highly reflective transparent thin film of indium oxide is formed by a reactive sputtering method using a metal target containing indium as a main ingredient or a sintered target containing indium oxide as a main ingredient. The metal thin film of silver or a silver alloy is formed by sputtering using a silver target or a silver alloy target.

In a case where a multi-layered transparent conductive structure including the metal thin films and the highly reflective transparent thin films is used as the electromagnetic wave shielding layer 319 in the display filer according to one embodiment of the present invention, the multi-layered transparent conductive structure may also serve as a near-infrared ray shielding layer.

Accordingly, if the electromagnetic wave shielding layer 319 shields near-infrared rays as well as electromagnetic waves, formation of the near-infrared ray shielding layer 313 may be omitted. Of course, the near-infrared ray shielding layer 313 may also be formed separately from the electromagnetic wave shielding layer 319.

According to an embodiment of the present invention, in a case where the electromagnetic wave shielding layer 319 is a conductive mesh film, the electromagnetic wave shielding layer 319 may be made of a polymer resin containing a near-infrared ray absorbent colorant absorbing light with wavelengths in a near-infrared ray region in order to absorb a near-infrared ray emitted from a panel assembly. For example, the colorant may be an organic dye, such as anthraquinones, cyanines, naphthoquinone phthalocyanine, naphthalocyanienes, dimonium or nickel dithiol.

The electromagnetic wave shielding layer 319 may be formed on any surface of the transparent substrate 317. According to an embodiment of the present invention, it is attached to the transparent substrate 317 by an adhesive on the opposite side of the transparent substrate 317 to the neon light shielding layer 315 and the near-infrared ray shielding layer 313.

The antireflective layer 311 reduces reflection of external light such as sunlight.

Thus, the antireflective layer 311 is generally disposed on the outermost surface of a front-side filter and is exposed to the outside. One surface of the antireflective layer 311 may be in contact with the filter base 320. It is preferable that an additional antireflective layer is positioned at the opposite side of the filter base 320 with respect to the antireflective layer 311, that is, at the side facing the panel assembly, to prevent reflection of light emitted from a panel assembly.

The antireflective layer 311 has an edge pattern that receives a fixing means used to fix the front-side filter to a display device.

Here, the fixing means may be an adhesive such as a double-sided adhesive tape.

The edge pattern may be formed in various manners. As shown in FIG. 3, the edge pattern may be formed, for example, by removing an edge portion of the antireflective layer 311 so that some portions of the near-infrared ray shielding layer 313 are exposed.

A portion of the antireflective layer is removed because the antireflective layer 311 has a characteristic in which adhesives do not easily stick thereto. The antireflective layer not only has an antireflection function for preventing reflection of external light but also has an anti-smudge function for preventing the surface of a front-side filter from being smudged due to human contact or other contaminant. Accordingly, the antireflective layer 311 also has a generally anti-smudge characteristic. Such an anti-smudge antireflective layer 311 does not permit an adhesive or smudges to be attached thereto. For such reasons, according to an embodiment of the present invention, an underlying layer (the near-infrared ray layer 313) is exposed through the removed portion of the antireflective layer 311 and an adhesive is applied to the exposed underlying layer through the edge pattern so that the adhesive is tightly glued to the front-side filter.

Figure 4A:
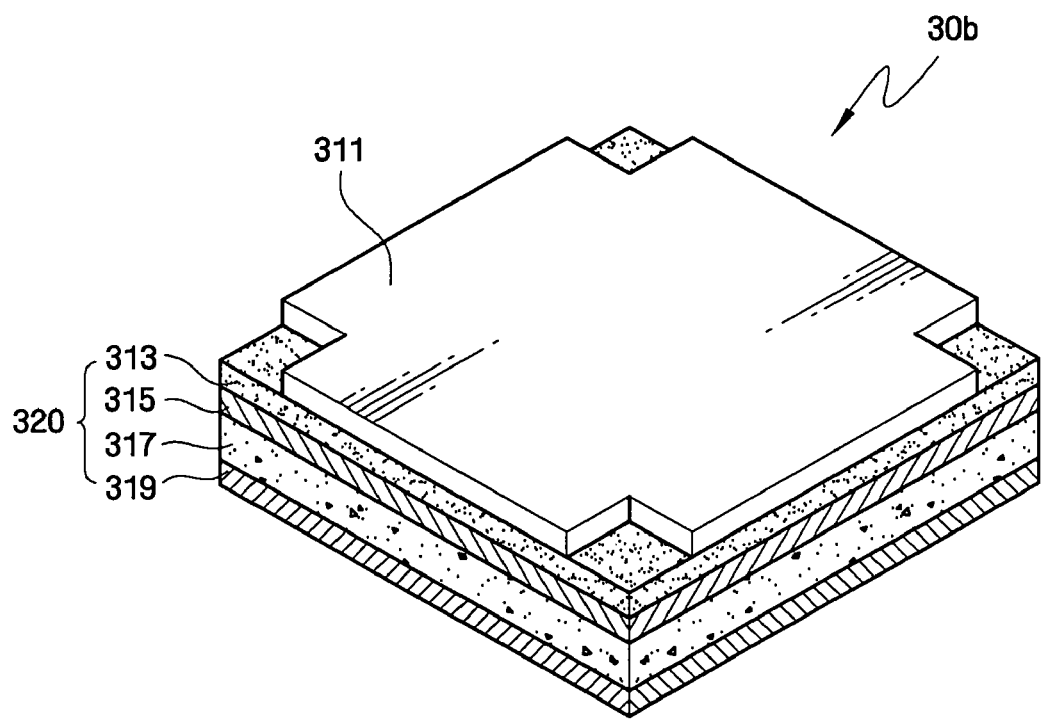
FIGS. 4A and 4B are perspective views illustrating exemplary edge patterns provided to an antireflective layer.
Figure 4B:
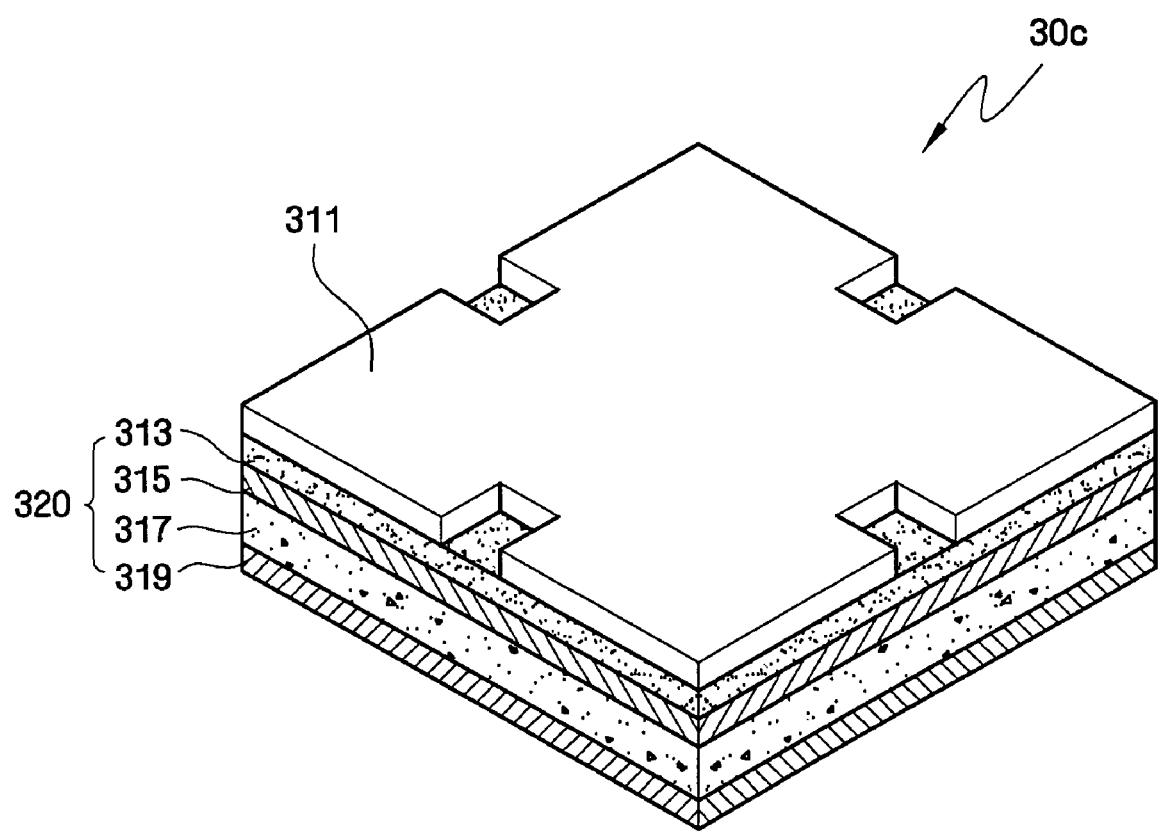

FIGS. 4A and 4B are perspective views illustrating exemplary edge patterns provided to an antireflective layer.

The edge pattern of the antireflective layer 311 can be formed to expose all the edge portions of the underlying layer of the antireflective layer 311 by removing, such as by cutting away, all the edge portions of the antireflective layer 311, like in FIG. 3.

Alternatively, referring to FIGS. 4A and 4B, front-side filters 30b and 30c may have an edge pattern formed to expose only corners or parts of edge portions of the underlying layer (the near-infrared ray shielding layer 313) of the antireflective layer 311.

Like in FIG. 3, a surface of the filter base 320 formed under the antireflective layer 311 is exposed at positions where the edge pattern is provided, and an adhesive for fixing a front-side filter is applied to the exposed surface.

It is preferable that a width "A" of the edge pattern is in the range from 1 to 10% of the diagonal length of the antireflective layer 311.

For example, in a 50 inch-standard size front-side filter, a width of the edge pattern is about 0.5 to 5 inches. In the case of 70 inch-standard size, the width of the edge pattern is about 0.7 to 7 inches.

In the front-side filter 30a, 30b, 30c while the antireflective layer 311 should be formed at the outermost surface thereof, the near-infrared ray shielding layer 313, the neon light shielding layer 315 and the electromagnetic wave shielding layer 319 may be stacked in various sequences. Furthermore, a color correction layer (not shown) may be additionally joined thereto.

Among the near-infrared layer 313, the neon light shielding layer 315, the electromagnetic wave shielding layer 319, and the color correction layer (not shown), two or more layers are combined with one another to form a single layer, that is, a hybrid layer.

Figure 5:
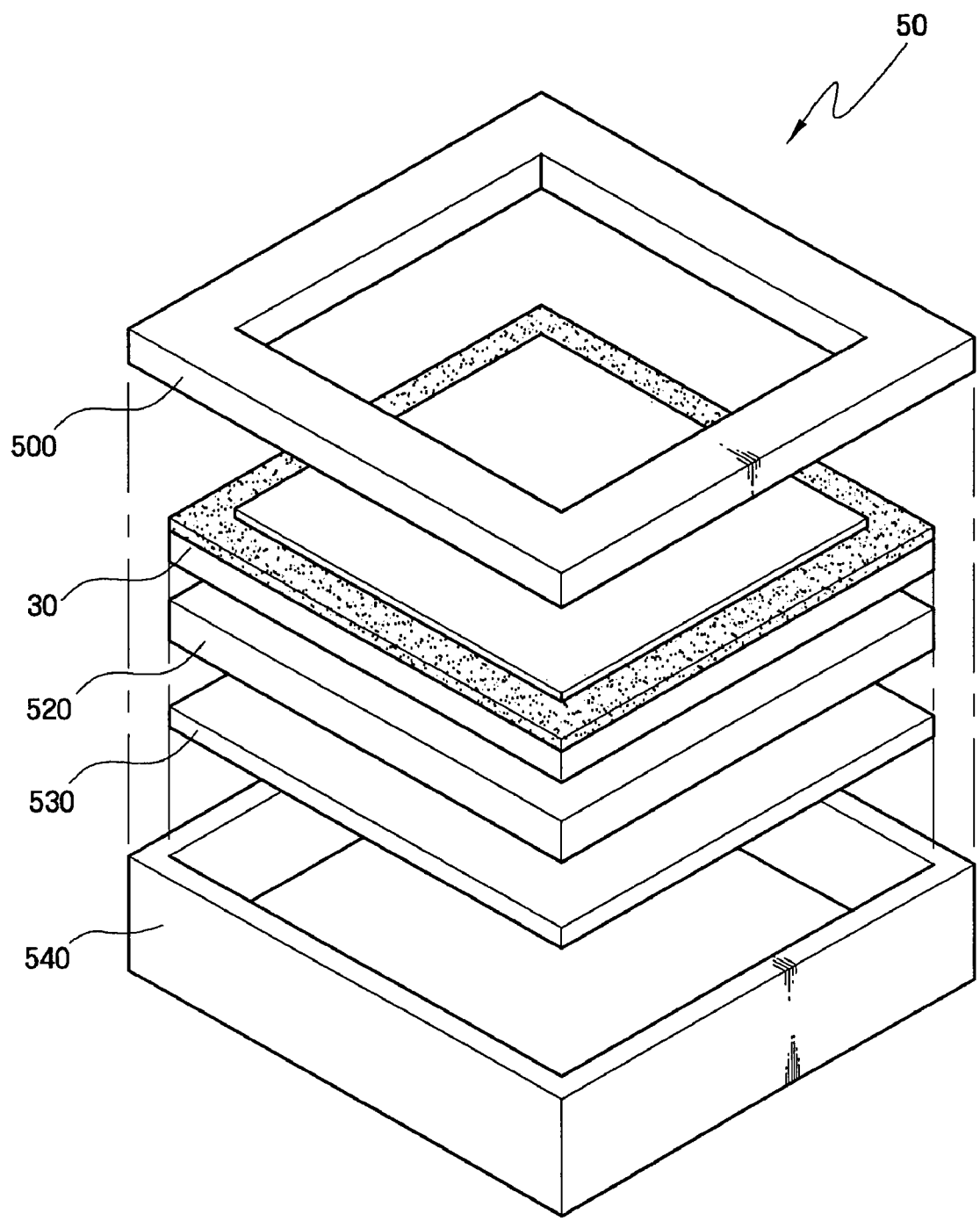
FIG. 5 is an exploded perspective view illustrating a PDP device according to an embodiment of the present invention.

FIG. 5 is an exploded perspective view illustrating a PDP device 50 according to an embodiment of the present invention.

Referring to FIG. 5, the PDP device 50 includes a case 540, a cover 500, a driving circuit board 530 enclosed by the case 540, a panel assembly 520 in which a gas discharge occurs, and a front-side filter 30.

The front-side filter 30 may be any one of the front-side filter 30a, 30b and 30c described above.

The case 540 defines the shape of the PDP device 50 and encloses the driving circuit board 530 and the panel assembly 520 used for displaying an image.

The cover 500 covers an upper surface of the case 540, thereby serving as a front frame facing a viewer.

The panel assembly 520 serves to emit light by a discharge of gas existing between electrodes when a high voltage is applied to the electrodes.

The driving circuit board 530 is a board having a driving circuit for driving the panel assembly 520 and serves to apply a voltage to each cell and control a voltage to be applied to each cell.

The front-side filter 30 is disposed between the panel assembly 520 and the cover 500 described above. That is, the front-side filter 30 has the edge pattern at its edge portions so that an adhesive is provided in the edge pattern to enable the front-side filter 30 to be fixed to the cover 500.

The front-side filter 30 included in the PDP device 50 according to the embodiment of the present invention shown in FIG. 5 is the same as the front-side filter 30a, 30b, 30c described above. Accordingly, a description of the front-side filter 30 will not be given again. Further, the case 540, the cover 500, the panel assembly 520 and the driving circuit board 530 may be the same as those of conventional art.

The front-side filter and the PDP device including the front-side filter according to the present invention provide at least the advantage that the front-side filter is easily attached to a cover in a PDP set but is difficult to detach from the cover after long term use.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A front-side filter comprising:
   a filter base having a near-infrared ray shielding function, a neon light shielding function, and an electromagnetic wave shielding function; and
   an antireflective layer positioned over the filter base, the antireflective layer having an edge pattern, formed on a side of the filter base in such a way that only parts and not the entirety of the edge portion of an upper surface of the filter base are exposed through the edge pattern to provide an adhesive fixing means formed in the exposed edge pattern of the upper surface of the filter base for fixing of a cover to the front-side filter.

2. The front-side filter of claim 1, wherein the edge pattern is formed by removing parts of the edge portion of the antireflective layer so that parts of the edge portion of an underlying layer of the filter base, positioned under the antireflective layer, are exposed through the edge pattern.

3. The front-side filter of claim 1, wherein a width of the edge pattern is about 1 to 10% of a diagonal length of the antireflective layer.

4. The front-side filter of claim 1, further comprising an antireflective film provided to the other side of the filter base to prevent reflection of light emitted from a panel assembly.

5. A plasma display panel device, comprising:
   a case;
   a cover for covering an upper surface of the case;
   a driving circuit board enclosed by the case;
   a panel assembly disposed on the driving circuit board and enclosed by the case; and
   a front-side filter including:
      a filter base having at least one function among a near-infrared ray shielding function, a neon light shielding function, and an electromagnetic wave shielding function; and
      an antireflective layer positioned over the filter base, the antireflective layer having an edge pattern, formed on a side of the filter base in such a way that only parts and not the entirety of the edge portion of an upper surface of the filter base are exposed through the edge pattern to provide an adhesive fixing means formed in the exposed edge pattern of the upper surface of the filter base,
   wherein the adhesive fixing means fixes the front-side filter to the cover.

6. The plasma display panel device of claim 5, wherein the edge pattern is formed by removing parts of the edge portion of the antireflective layer so that parts of the edge portion of an underlying layer of the filter base, positioned under the antireflective layer, are exposed through the edge pattern.

7. The plasma display panel device of claim 5, wherein a width of the edge pattern is about 1 to 10% of a diagonal length of the antireflective layer.

8. The plasma display panel device of claim 5, further comprising an antireflective film provided to the other side of the filter base to prevent reflection of light emitted from a panel assembly.

9. A plasma display panel device, comprising:
   a case;
   a cover for covering an upper surface of the case;
   a driving circuit board enclosed by the case;
   a panel assembly disposed on the driving circuit board and enclosed by the case; and
   a front-side filter including:
      a filter base having a neon light shielding function, an electromagnetic wave shielding function, and a near-infrared ray shielding or absorbing function; and
      an antireflective layer positioned over the filter base, the antireflective layer having an edge pattern, formed on a side of the filter base in such a way that only parts and not the entirety of the edge portion of an upper surface of the filter base are exposed through the edge pattern to provide an adhesive fixing means formed in the exposed edge pattern of the upper surface of the filter base for fixing of the cover to the front-side filter.

* * * * *